(12) United States Patent
Kim et al.

(10) Patent No.: US 8,987,759 B2
(45) Date of Patent: Mar. 24, 2015

(54) SUBSTRATE FOR A DISPLAY DEVICE

(71) Applicant: LG Display Co., Ltd., Seoul (KR)

(72) Inventors: Youn-Oh Kim, Seoul (KR); JongChun Lim, Goyang-si (KR); JaeHyun You, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/202,676

(22) Filed: Mar. 10, 2014

(65) Prior Publication Data

US 2014/0197553 A1     Jul. 17, 2014

Related U.S. Application Data

(62) Division of application No. 13/644,043, filed on Oct. 3, 2012, now Pat. No. 8,709,909.

(30) Foreign Application Priority Data

Oct. 7, 2011   (KR) .......................... 10-2011-0102261

(51) Int. Cl.
    *H01L 33/00*   (2010.01)

(52) U.S. Cl.
    USPC .................... 257/89; 257/87; 257/98; 257/99

(58) Field of Classification Search
    USPC ........... 257/12–13, 27, 66, 69, 72, 79, 88, 89, 257/98–100, 431–433, 347, 344; 313/112, 313/501, 503, 506
    See application file for complete search history.

(56) References Cited

U.S. PATENT DOCUMENTS 8,558,239 B2 * 10/2013 Lee et al. ......................... 257/72

* cited by examiner

*Primary Examiner* — Dung A. Le
(74) *Attorney, Agent, or Firm* — Brinks Gilson & Lione

(57) ABSTRACT

A substrate for a display device comprises a first pattern and a second pattern disposed within an active region of the substrate; a first overlay pattern disposed at corner regions of the active region and made of the same material as that of the first pattern; and a second overlay pattern disposed at corner regions of the active region and made of the same material as that of the second pattern, wherein the first overlay pattern includes gradations, and the second overlay pattern includes gradations to face the gradations of the first overlay pattern.

4 Claims, 11 Drawing Sheets

SUBSTRATE FOR A DISPLAY DEVICE

The present patent document is a divisional of U.S. patent application Ser. No. 13/644,043, filed Oct. 3, 2012, which claims benefit to the Korean Patent Application No. 10-2011-0102261, filed on Oct. 7, 2011, which is hereby incorporated by reference for all purposes as if fully set forth herein.

BACKGROUND

1. Field of the Invention

The present disclosure relates to a substrate for a display device, and more particularly, to a method for identifying shift levels of fine patterns formed on a substrate for a display device.

2. Discussion of the Related Art

As display devices, which can substitute for a cathode ray tube, a liquid crystal display device, a plasma display panel, and an organic light emitting display device have been developed.

The display device is manufactured by forming various types of fine patterns such as a thin film transistor on a substrate, and various types of test processes are performed to determine whether there is a defect in the display device during a manufacturing process of the display device or after the manufacturing process is completed.

As one of the test processes of the display device, there is provided a process for identifying shift levels of fine patterns formed on a substrate.

Hereinafter, a method for identifying shift levels of fine patterns formed on a substrate for a display device according to the related art will be described with reference to the accompanying drawings.

FIGS. 1a and 1b are plane views illustrating a method for identifying shift levels of fine patterns according to the related art.

Prior to description of a detailed process, a layout of an entire substrate will be described in brief with reference to FIGS. 1a and 1b. A plurality of active regions 10, for example, two active regions 10 may be formed on a substrate 1. Each of the active regions is cut by a scribing process, and then constitutes a panel of the display device.

Each of the active regions 10 constituting the panel of the display device is provided with various types of patterns 11 and 12, and overlay patterns 21 and 22 are formed outside the active regions 10 to identify shift levels of the patterns 11 and 12.

Hereinafter, each process will be described in more detail.

First of all, as shown in FIG. 1a, the first pattern 11 is formed on the active region 10 of the substrate 1, and at the same time the first overlay pattern 21 is formed outside the active region 10.

An example of the first pattern 11 may include a gate line arranged in a horizontal direction, and the first overlay pattern 21 may be formed in a square structure, for example.

The first pattern 11 and the first overlay pattern 21 may be formed through a patterning process such as photolithography. In this case, the first pattern 11 and the first overlay pattern 21 may be formed at the same time using a first mask pattern corresponding to the first pattern 11 and the first overlay pattern 21.

Next, as shown in FIG. 1b, the second pattern 12 is formed on the active region 10 of the substrate 1, and at the same time the second overlay pattern 22 is formed outside the active region 10.

An example of the second pattern 12 may include a data line arranged in a vertical direction, and the second overlay pattern 22 may be formed in a square structure arranged within the first overlay pattern 21, for example.

The second pattern 12 and the second overlay pattern 22 may be formed through a patterning process such as photolithography. In this case, the second pattern 12 and the second overlay pattern 22 may be formed at the same time using a second mask pattern corresponding to the second pattern 12 and the second overlay pattern 22.

According to the aforementioned related art method, the shift levels of the first pattern 11 and the second pattern 12 are identified using the first overlay pattern 21 and the second overlay pattern 22, which are formed outside the active region 10.

In other words, since the first pattern 11 and the first overlay pattern 21 are formed using the first mask pattern at the same time, if a process error such as misalignment of the first mask pattern occurs, the first pattern 11 and the first overlay pattern 21 may be shifted at the same level.

Also, since the second pattern 12 and the second overlay pattern 22 are formed using the second mask pattern at the same time, if a process error such as misalignment of the second mask pattern occurs, the second pattern 12 and the second overlay pattern 22 may be shifted at the same level.

Since the first pattern 11 and the second pattern 12 are finely formed within the active region 10, it is not easy to identify the shift levels of the first pattern 11 and the second pattern 12. Accordingly, the shift level of the first pattern 11 is identified through the shift level of the first overlay pattern 21, and the shift level of the second pattern 12 is identified through the shift level of the second overlay pattern 22.

However, the aforementioned related art method has problems as follows.

According to the related art method, if a process error occurs, it is regarded that the shift level of the first pattern 11 is the same as that of the first overlay pattern 21 and the shift level of the second pattern 12 is the same as that of the second overlay pattern 22. However, the shift level of the first pattern 11 is not the same as that of the first overlay pattern 21 actually. Likewise, the shift level of the second pattern 12 is not the same as that of the second overlay pattern 22 actually.

In other words, even though it is determined that the first pattern 11 and the second pattern 12 are formed exactly as a shift between the first overlay pattern 21 and the second overlay pattern 22 does not occur, it is likely to be determined through a later accurate test process that the first pattern 11 and the second pattern 12 are not formed exactly.

For this reason, if the shift levels of the first pattern 11 and the second pattern 12 are determined using the shift levels of the first overlay pattern 21 and the second overlay pattern 22, an error in determining the shift levels may occur.

In addition, according to the related art method, the first overlay pattern 21 and the second overlay pattern 22 are formed outside the active region 10 constituting the panel of the display panel. Accordingly, since the first overlay pattern 21 and the second overlay pattern 22 do not exist in the panel after the scribing process, a problem occurs in that the first overlay pattern 21 and the second overlay pattern 22 cannot be used in a state of the panel.

BRIEF SUMMARY

A method for manufacturing a substrate for a display device comprises forming a first pattern within an active region of the substrate and at the same time forming a first overlay pattern at corner regions of the active region; and forming a second pattern within the active region of the substrate and at the same time forming a second overlay pattern at corner regions of the active region, wherein the first overlay pattern includes gradations arranged in a predetermined direction, and the second overlay pattern includes gradations arranged in the predetermined direction to face the gradations of the first overlay pattern.

In another aspect of the present invention, a substrate for a display device comprises a first pattern and a second pattern disposed within an active region of the substrate; a first overlay pattern disposed at corner regions of the active region and made of the same material as that of the first pattern; and a second overlay pattern disposed at corner regions of the active region and made of the same material as that of the second pattern, wherein the first overlay pattern includes gradations arranged in a predetermined direction, and the second overlay pattern includes gradations arranged in the predetermined direction to face the gradations of the first overlay pattern.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE DRAWINGS AND THE PRESENTLY PREFERRED EMBODIMENTS

Reference will now be made in detail to the exemplary embodiments of the present invention, examples of which are illustrated in the accompanying drawings. Wherever possible, the same reference numbers will be used throughout the drawings to refer to the same or like parts.

Figure 1A:
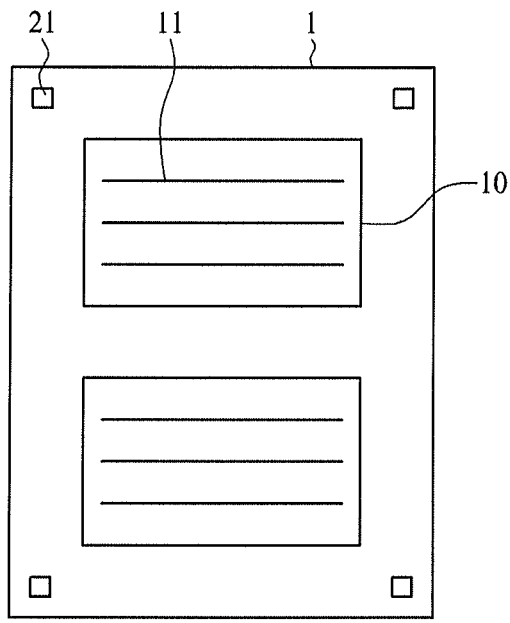
FIGS. 1a and 1b are plane views illustrating a method for identifying shift levels of fine patterns according to the related art.
Figure 1B:
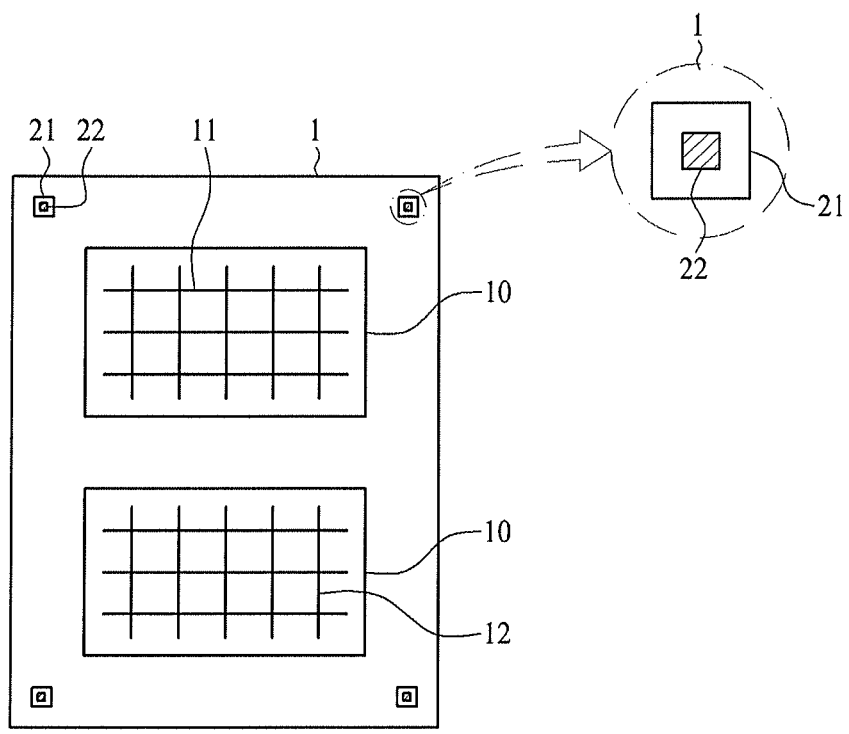
Figure 2A:
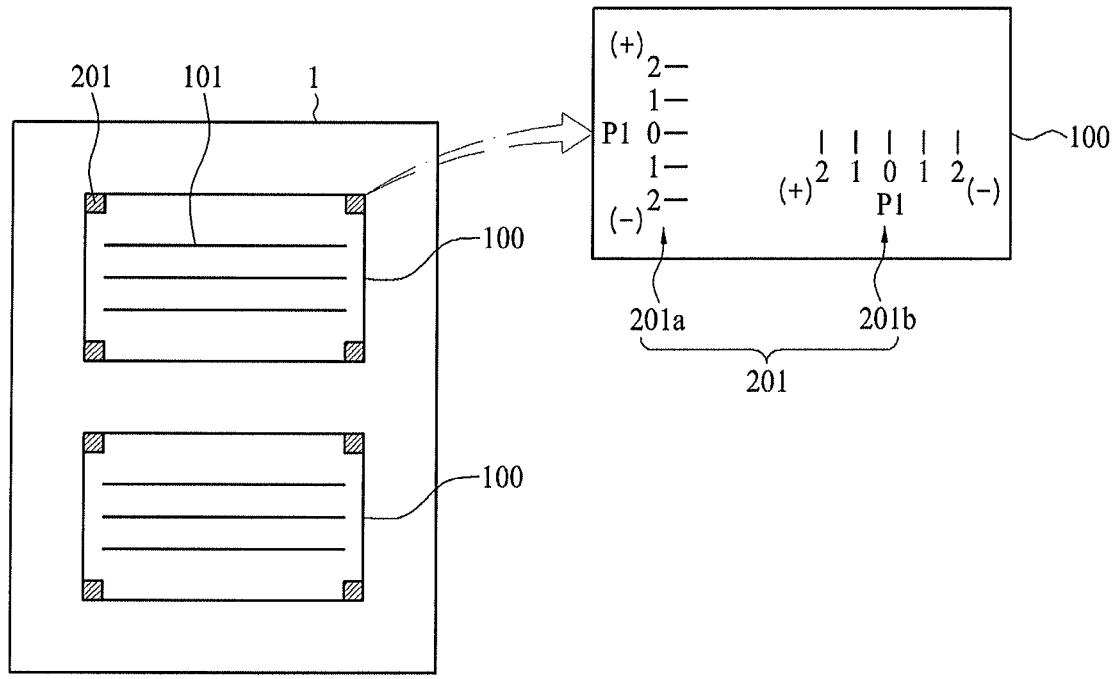
FIGS. 2a and 2b are plane views illustrating a method for manufacturing a substrate for a display device according to one embodiment of the present invention.
Figure 2B:
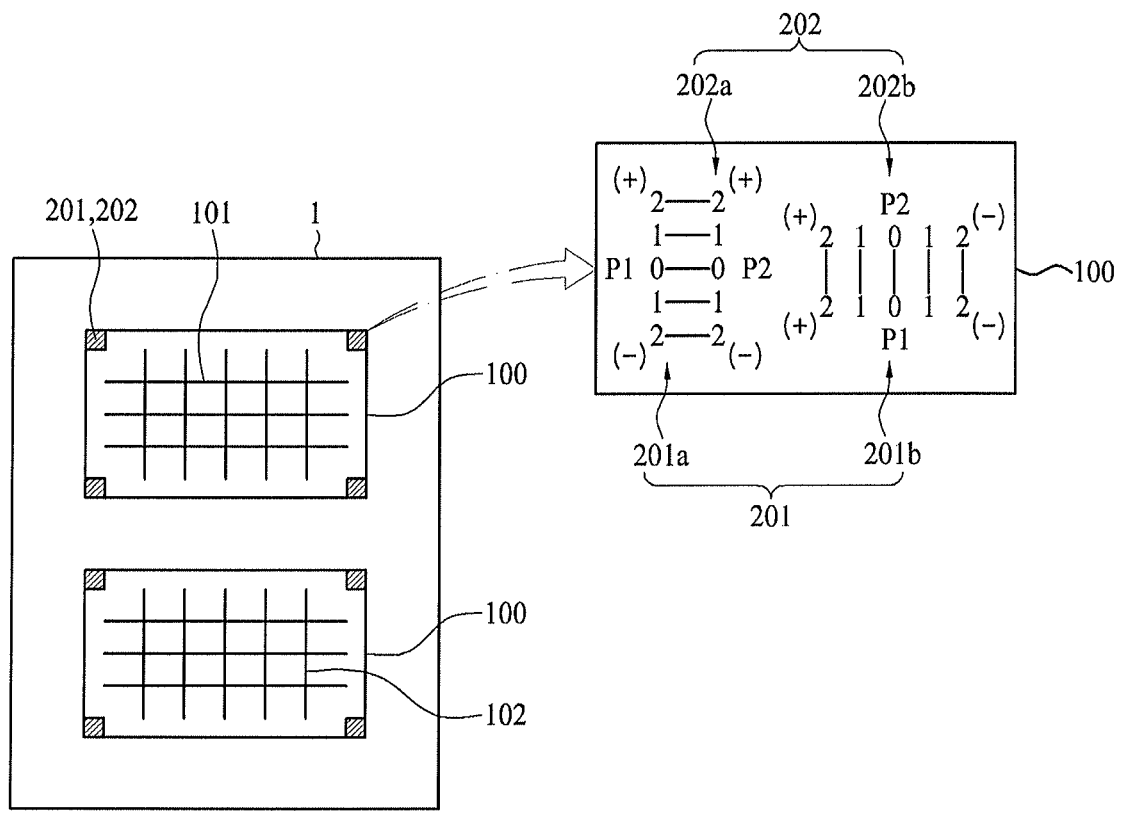

FIGS. 2a and 2b are plane views illustrating a method for manufacturing a substrate for a display device according to one embodiment of the present invention.

First of all, as shown in FIG. 2a, a first pattern 101 is formed within an active region 100 of a substrate 1, and at the same time a first overlay pattern 201 is formed at each corner region of the active region 100.

The active region 100 is later cut by a scribing process to constitute a panel of the display device. A plurality of active regions may be formed on the substrate 1. Although two active regions 100 are formed on the substrate 1 in the drawings, various modifications may be made in view of the number and arrangement of the active regions 100.

A line representing the active region 100 is a virtual line actually, and constitutes a corner of the panel after the scribing process is performed for the active regions.

The first pattern 101 is formed within the active region 100 at a predetermined shape. For example, if the substrate for the display device is a thin film transistor substrate, the first pattern 101 may be a gate line arranged in a horizontal direction.

The first overlay pattern 201 may be formed at edge regions within the active region 100, especially at corner regions within the active region 100. Although the first overlay pattern 201 is formed at four corner regions within the active region 100 in the drawings, the first overlay pattern 201 may be formed at at least one of the four corner regions. For example, the first overlay pattern may be formed at two facing corner regions within the active region 100.

The first pattern 101 and the first overlay pattern 201 are formed through one patterning process at the same time. Accordingly, the first pattern 101 and the first overlay pattern 201 may be made of the same material.

The first pattern 101 and the first overlay pattern 201 may be formed through a photolithography process. In this case, the first pattern 101 and the first overlay pattern 201 may be formed at the same time by using a first mask pattern corresponding to the first pattern 101 and the first overlay pattern 201.

The first pattern 101 and the first overlay pattern 201 may be formed at the same time by using a roll printing process.

Referring to an enlarged view marked with an arrow in FIG. 2a, the first overlay pattern 201 may include a first sub pattern 201a and a second sub pattern 201b.

The first sub pattern 201a may include gradations or markings (hereinafter "gradations" is commonly called for "gradations or markings"), especially horizontal gradations arranged at predetermined intervals in a first direction, for example, vertical direction.

The second sub pattern 201b may include gradations, especially vertical gradations arranged at predetermined intervals in a second direction different from the first direction, for example, horizontal direction.

Also, each of the first sub pattern 201a and the second sub pattern 201b may further include numbering of gradations, such as 0, 1, and 2, and may further include signs of numbering, such as (+) and (−).

Also, the first sub pattern 201b and the second sub pattern 201b may further include a title representing the first pattern 101 formed therewith, for example, a title of the first pattern 101, such as P1.

Next, as shown in FIG. 2b, a second pattern 102 is formed within the active region 100 of a substrate 1, and at the same time a second overlay pattern 202 is formed at each corner region of the active region 100.

The second pattern 102 is formed within the active region 100 at a predetermined shape. For example, if the substrate for the display device is a thin film transistor substrate, the second pattern 102 may be a data line arranged in a vertical direction.

The second overlay pattern 202 may be formed at edge regions within the active region 100, especially at corner regions within the active region 100.

The second pattern 102 and the second overlay pattern 202 are formed at the same time through one patterning process. Accordingly, the second pattern 102 and the second overlay pattern 202 may be made of the same material.

The second pattern 102 and the second overlay pattern 202 may be formed through a photolithography process. In this case, the second pattern 102 and the second overlay pattern 202 may be formed at the same time by using a second mask pattern corresponding to the second pattern 102 and the second overlay pattern 202.

The second pattern 102 and the second overlay pattern 202 may be formed at the same time by using a roll printing process.

Referring to an enlarged view marked with an arrow in FIG. 2b, the second overlay pattern 202 may include a third sub pattern 202a and a fourth sub pattern 202b.

The third sub pattern 202a may include gradations, especially horizontal gradations arranged at predetermined intervals in a first direction, for example, vertical direction. The third sub pattern 202a corresponds to the first sub pattern 201a and symmetrically faces the first sub pattern 201a.

The fourth sub pattern 202b may include gradations, especially vertical gradations arranged at predetermined intervals in a second direction different from the first direction, for example, horizontal direction. The fourth sub pattern 202b corresponds to the second sub pattern 201b and symmetrically faces the second sub pattern 201b.

Also, each of the third sub pattern 202a and the fourth sub pattern 202b may further include numbering of gradations, such as 0, 1, and 2, and may further include signs of numbering, such as (+) and (−).

Also, the third sub pattern 202a and the fourth sub pattern 202b may further include a title representing the second pattern 102 formed therewith, for example, a name of the second pattern 102, such as P2.

In the aforementioned manufacturing method according to the present invention, a method for identifying shift levels of the first pattern 101 and the second pattern 102 will be described below.

The first overlay pattern 201 represents a shift level of the first pattern 101, and the second overlay pattern 202 represents a shift level of the second pattern 102. In other words, the shift level of the first pattern 101 is identified through the shift level of the first overlay pattern 201, and the shift level of the second pattern 102 is identified through the shift level of the second overlay pattern 202.

In this case, the first overlay pattern 201 may be a reference pattern. Accordingly, the shift level of the second overlay pattern 202 may be identified based on the first overlay pattern 201, whereby the shift levels of the first pattern 101 and the second pattern 102 are finally identified to determine whether there is a defect in the product.

In particular, the shift levels in up and down direction of the first pattern 101 and the second pattern 102 may be identified through the first sub pattern 201a and the third sub pattern 202a, which correspond to each other. Also, the shift levels in left and right direction of the first pattern 101 and the second pattern 102 may be identified through the second sub pattern 201b and the fourth sub pattern 202b, which correspond to each other.

The shift levels of the first and second patterns 101 and 102 will be described in more detail. The first sub pattern 201a may be a reference pattern of the third sub pattern 202a. Accordingly, the shift level of the third sub pattern 202a is identified based on the first sub pattern 201a. In detail, the shift levels in up and down direction of the first pattern 101 and the second pattern 102 may be identified by checking whether gradations constituting the first sub pattern 201a meet gradations constituting the third sub pattern 202a.

However, the shift levels in left and right direction of the first pattern 101 and the second pattern 102 cannot be identified by checking whether gradations constituting the first sub pattern 201a meet gradations constituting the third sub pattern 202a.

Accordingly, the shift levels in left and right direction of the first pattern 101 and the second pattern 102 may be identified by checking whether gradations constituting the second sub pattern 201b meet gradations constituting the fourth sub pattern 202b.

Figure 3A:
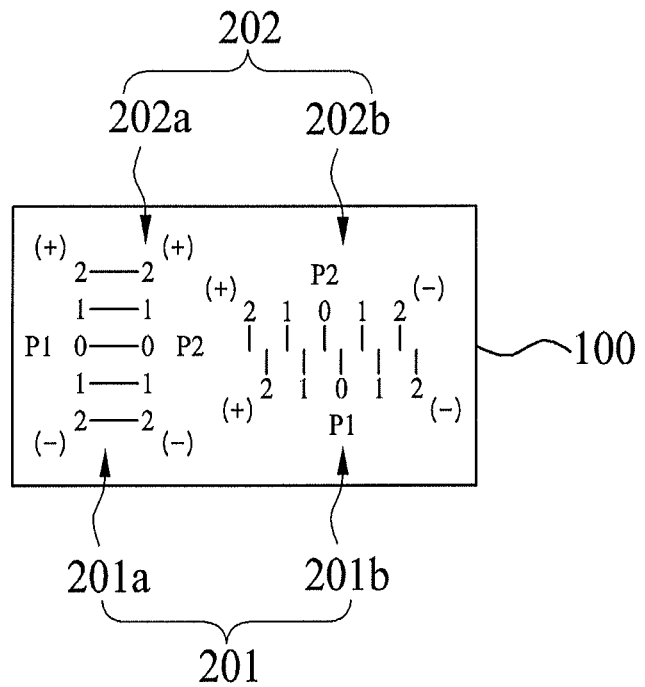
FIGS. 3a and 3b illustrate that a first pattern and a second pattern, which are formed on a substrate for a display device, are shifted.
Figure 3B:
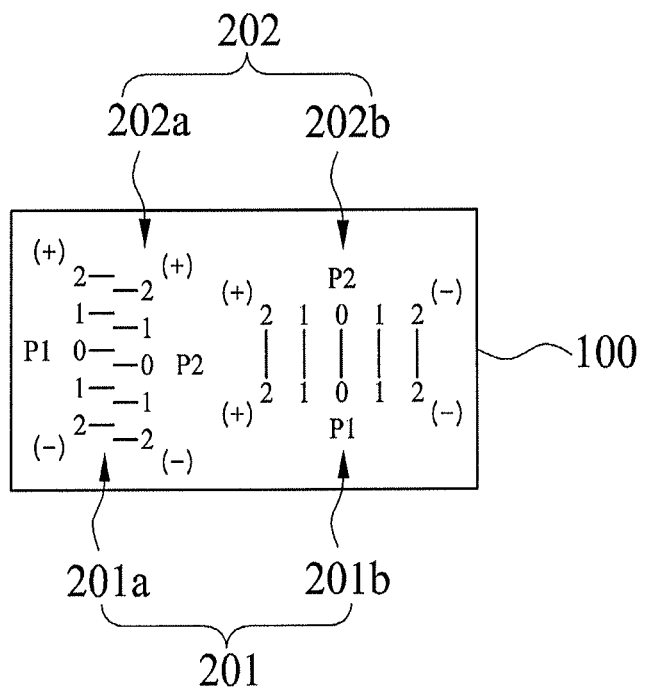

Identification of the shift levels in left and right direction or up and down direction of the first pattern 101 and the second pattern 102 through the first to fourth sub patterns 201a, 201b, 202a, and 202b may easily be understood referring to FIGS. 3a and 3b.

FIGS. 3a and 3b illustrate that a first pattern and a second pattern, which are formed on a substrate for a display device, are shifted. FIG. 3a illustrates that the first pattern 102 and the second pattern 102 are not shifted in up and down direction but shifted in left and right direction, and FIG. 3b illustrates that the first pattern 102 and the second pattern 102 are not shifted in left and right direction but shifted in up and down direction.

As shown in FIG. 3a, even though the gradations constituting the first sub pattern 201a meet the gradations constituting the third sub pattern 202a, the gradations constituting the second sub pattern 201b may not meet the gradations constituting the fourth sub pattern 202b.

Accordingly, if the first overlay pattern 201 includes only the first sub pattern 201a and the second overlay pattern 202 includes only the third sub pattern 202a, the shift levels of the first pattern 101 and the second pattern 102, especially the shift levels in left and right direction may not be identified exactly.

However, since the shift levels in left and right direction of the first pattern 101 and the second pattern 102 may be identified by checking how the first sub pattern 201a is overlapped with the third sub pattern 202a, the second sub pattern 201b and the fourth sub pattern 202b are not required essentially.

As shown in FIG. 3b, even though the gradations constituting the second sub pattern 201b meet the gradations constituting the fourth sub pattern 202b, the gradations constituting the first sub pattern 201a may not meet the gradations constituting the third sub pattern 202a.

Accordingly, if the first overlay pattern 201 includes only the second sub pattern 201b and the second overlay pattern 202 includes only the fourth sub pattern 202b, the shift levels of the first pattern 101 and the second pattern 102, especially the shift levels in up and down direction may not be identified exactly.

However, since the shift levels in up and down direction of the first pattern 101 and the second pattern 102 may be identified by checking how the second sub pattern 201b is overlapped with the fourth sub pattern 202b, the first sub pattern 201a and the third sub pattern 202a are not required essentially.

As described above, the shift levels of the first pattern 101 and the second pattern 102 may be identified by checking whether the gradations constituting the first overlay pattern 201 meet the gradations constituting the second overlay pattern 202. In order to more easily check whether the gradations constituting the first overlay pattern 201 meet the gradations constituting the second overlay pattern 202, as described above, numbering of the gradations, signs of numbering, and title of patterns may be used additionally.

According to the present invention as described above, since the first overlay pattern 201 and the second overlay pattern 202 are formed at corner regions within the active region 100 of the substrate 1, the shift levels of the first pattern 101 and the second pattern 102 may be identified more exactly than that in the related art. In other words, since the distance between the first overly pattern 201 and the first pattern 101 is reduced as compared with the related art, even though it is regarded that the shift level of the first pattern 101 is identical with the shift level of the first overlay pattern 201, the probability of an error is reduced as compared with the related art.

In particular, according to the present invention, since the first overlay pattern 201 and the second overlay pattern 202 are formed using gradations corresponding to each other, the shift levels may be identified more easily than the related art.

Also, since the first overlay pattern 201 and the second overlay pattern 202 are formed at corner regions within the active region 100 of the substrate 1, they exist in the panel even after the scribing process, whereby the shift levels of the first pattern 101 and the second pattern 102 may be identified using the first overly pattern 201 and the second overlay pattern 202 even in the panel state.

FIGS. 4a to 4e are plane views illustrating a method for manufacturing a substrate for a display device according to another embodiment of the present invention, and FIGS. 5a to 5e are cross-sectional views illustrating a method for manufacturing a substrate for a display device according to another embodiment of the present invention.

Each of process steps of FIGS. 5a to 5e correspond to each of process steps of FIGS. 4a to 4e.

The method for manufacturing a substrate for a display device according to another embodiment of the present invention relates to a method for manufacturing a thin film transistor substrate, and detailed descriptions which are identical with the aforementioned embodiment are omitted.

Figure 4A:
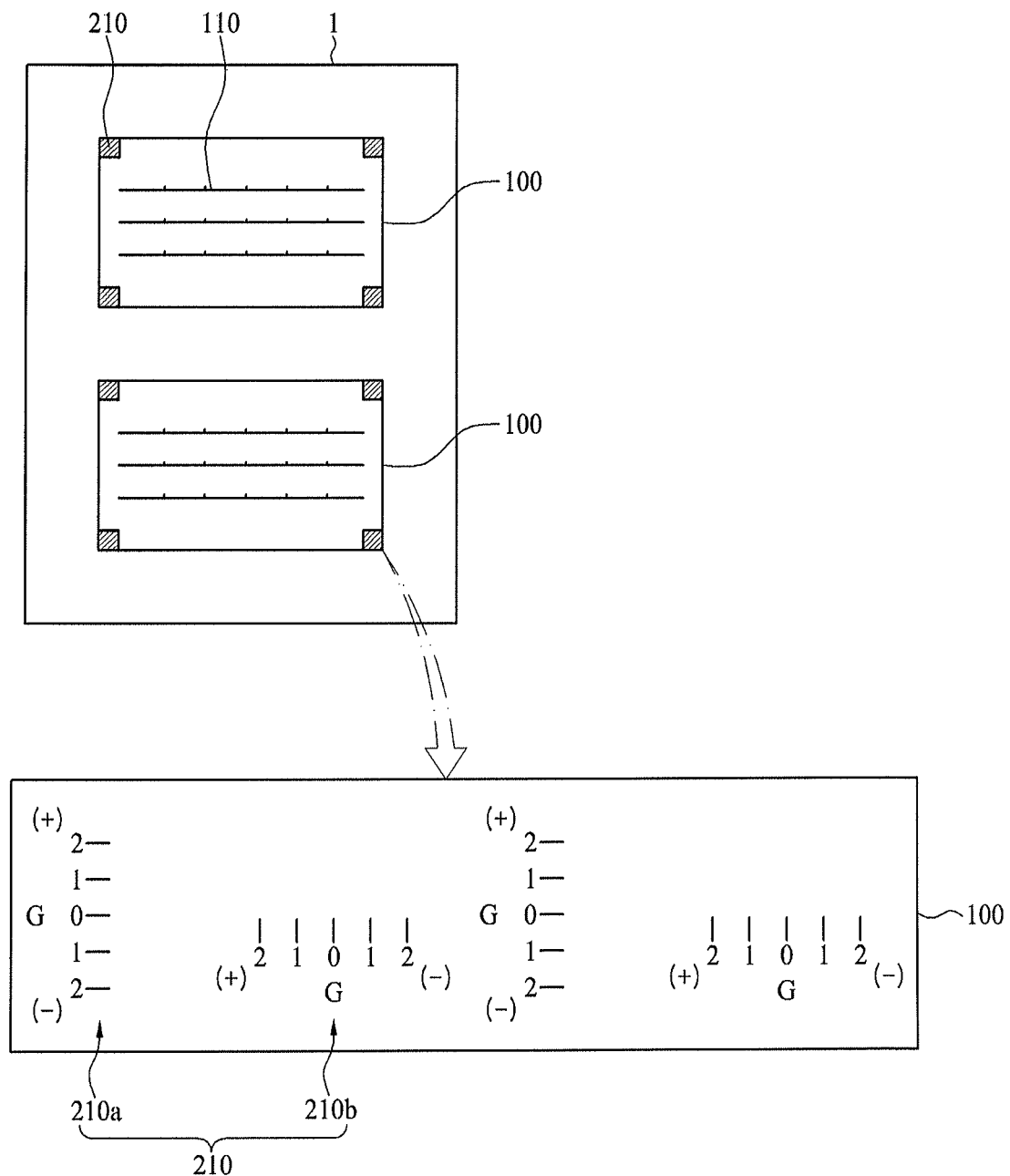
FIGS. 4a to 4e are plane views illustrating a method for manufacturing a substrate for a display device according to another embodiment of the present invention.
Figure 5A:
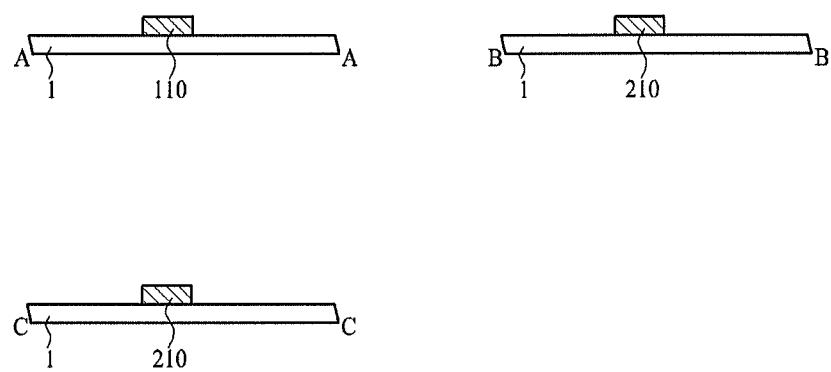
FIGS. 5a to 5e are plane views illustrating a method for manufacturing a substrate for a display device according to other embodiment of the present invention.

First of all, as shown in FIG. 4a and FIG. 5a, a gate pattern 110 is formed within the active region 100 of the substrate 1, and at the same time a gate overlay pattern 210 is formed at each corner region of the active region 100, especially at each edge region.

In FIG. 5a, a section taken along line A-A at a left side illustrates a region where the gate pattern 110 is formed, and a section taken along line B-B at a center and a section taken along line C-C at a right side illustrate a region where the gate overlay pattern 210 is formed. In particular, referring to FIG. 4a, since a total of two gate overlay patterns are formed, the section taken along line B-B at the center illustrates any one of the two gate overlay patterns 210, and the section taken along line C-C at the right side illustrates the other one of the two gate overlay patterns 210.

The gate pattern 110, as shown in FIG. 4a, may include a gate line arranged in a predetermined direction, for example, horizontal direction, and a gate electrode forked from the gate line. This gate pattern 110, as shown in FIG. 5a, is formed on the substrate 1.

The gate overlay pattern, as shown in FIG. 4a, may include a first gate overlay pattern 210a and a second gate overlay pattern 210b.

The first gate overlay pattern 210a may include gradations, numbering of the gradations, and signs of the numbering in the same manner as the aforementioned first sub pattern 201a.

The second gate overlay pattern 210b may include gradations, numbering of the gradations, and signs of the numbering in the same manner as the aforementioned second sub pattern 201b.

Also, the first gate overlay pattern 210a and the second gate overlay pattern 210b may include a title G of the gate pattern 110.

The gate pattern 110 and the gate overlay pattern 210 are formed through one patterning process at the same time.

Accordingly, the gate pattern 110 and the gate overlay pattern 210 may be made of the same material. For example, the gate pattern 110 and the gate overlay pattern 210 may be formed through a photolithography process. In this case, the gate pattern 110 and the gate overlay pattern 210 may be formed at the same time by using a gate mask pattern corresponding to the gate pattern 110 and the gate overlay pattern 210.

Although a plurality of gate overlay patterns 210, for example, two gate overlay patterns 210 may be formed at one corner region within the active region 100 as shown, three or more gate overlay patterns may be formed as the case may be. In other words, various modifications may be made in the number of the gate overlay patterns 210 in accordance with the number of patterns that should identify the shift levels.

As shown in FIG. 5a, the gate overlay pattern 210 is formed on the substrate 1.

Figure 4B:
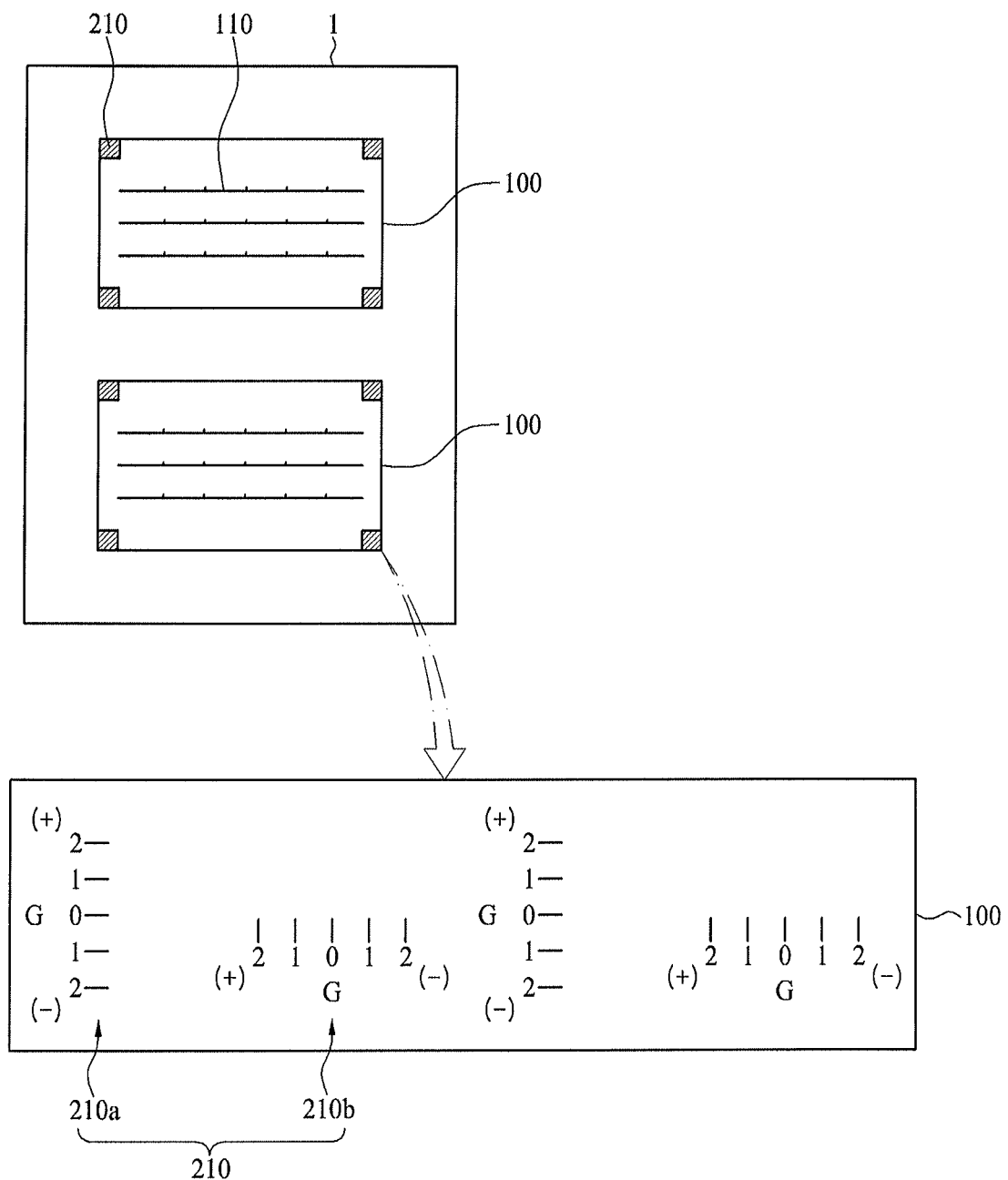
Figure 5B:
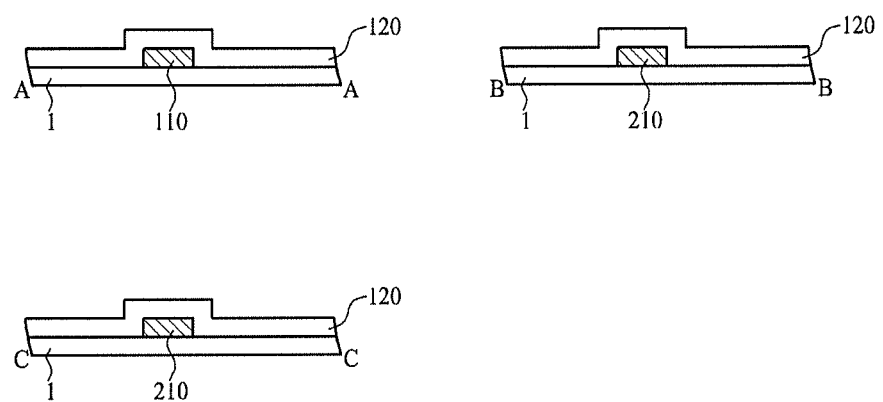

Next, as shown in FIG. 4b and FIG. 5b, a gate insulating film 120 is formed on the gate pattern 110 and the gate overlay pattern 210.

Referring to FIG. 5b, the gate insulating film 120 is formed on the substrate 1 including the gate pattern 110 and the gate overlay pattern 210. In particular, the gate insulating film 120 may be formed on the entire active region 100 of the substrate 1. Although FIG. 4b is same as FIG. 4a, the gate insulating film 120 is actually formed on the active region 100 of FIG. 4b.

Figure 4C:
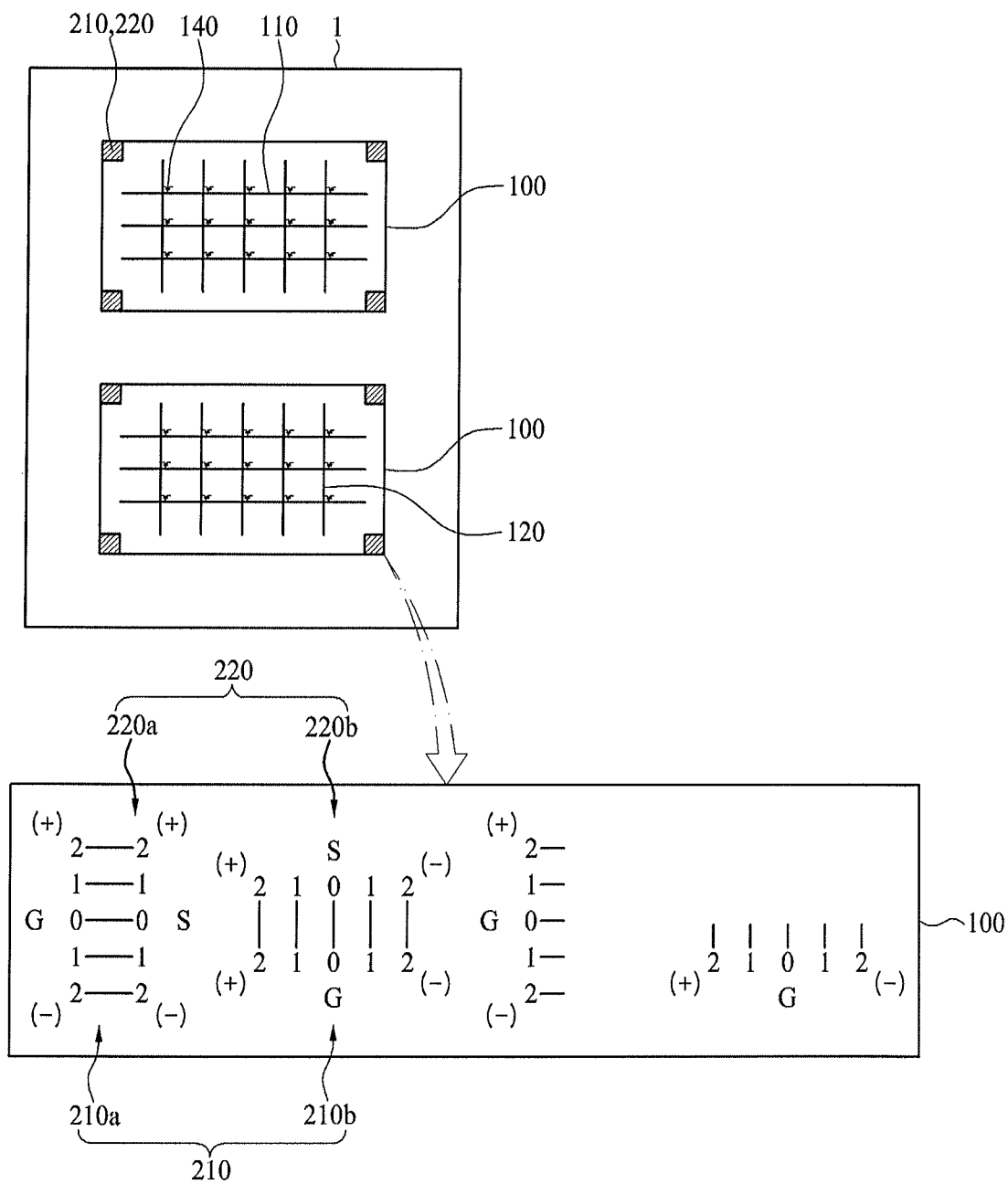
Figure 5C:
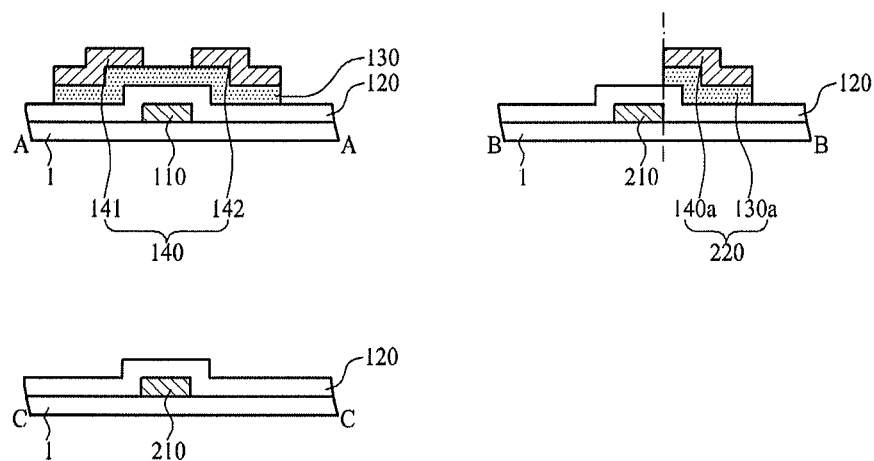

Next, as shown in FIG. 4c and FIG. 5c, a data pattern 140 is formed within the active region 100 of the substrate 1, and at the same time a data overlay pattern 220 is formed at each corner region of the active region 100, especially at each edge region.

The data pattern 140, as shown in FIG. 4c, may include a data line arranged in a predetermined direction, for example, vertical direction, a source electrode forked from the data line, and a drain electrode facing the source electrode.

Referring to a section taken along line A-A of FIG. 5c, a semiconductor layer 130 is formed on the gate insulating film 120, and the source electrode 141 and the drain electrode 142 are formed on the semiconductor layer 130 to face each other.

The data pattern 140 and the semiconductor layer 130 may be patterned using a half-tone mask. In this case, the data pattern 140 and the semiconductor layer 130 may be formed at the same pattern except for a space between the source electrode 141 and the drain electrode 142.

However, formation of the data pattern 140 and the semiconductor layer 130 is not limited to the above example. In other words, after the semiconductor layer 130 is patterned using a predetermined mask, the data pattern 140 may be formed using a separate mask. In this case, a separate element may additionally be provided to identify a shift level of the semiconductor layer 130.

The data overlay pattern 220, as shown FIG. 4c, may include a first data overlay pattern 220a and a second data overlay pattern 220b.

The first data overlay pattern 220a may include gradations, numbering of the gradations, and signs of the numbering in the same manner as the aforementioned third sub pattern 202a.

The second data overlay pattern 220b may include gradations, numbering of the gradations, and signs of the numbering in the same manner as the aforementioned fourth sub pattern 202b.

Also, the first data overlay pattern 220a and the second data overlay pattern 220b may include a title S of the data pattern 140.

As shown in a B-B section of FIG. 5c, the data overlay pattern 220 may include a semiconductor material layer 130a and a data pattern material layer 140a, which are sequentially formed on the gate insulating film 120. The semiconductor material layer 130a is a material layer constituting the aforementioned semiconductor layer 130, and the data pattern material layer 140a is a material layer constituting the aforementioned data pattern 140.

In other words, the data pattern 140 and the data overlay pattern 220 are formed through one patterning process at the same time. Particularly, as described above, if the semiconductor layer 130 and the data pattern 140 are patterned using a half-tone mask at one time, the data overlay pattern 220 includes the semiconductor material layer 130a and the data pattern material layer 140a.

As marked with a dotted line in a B-B section of FIG. 5c, if one end of the gate overlay pattern 210 meets one end of the data overlay pattern 220, it may be determined that a shift between the gate overlay pattern 210 and the data overlay pattern 220 will not occur.

Figure 4D:
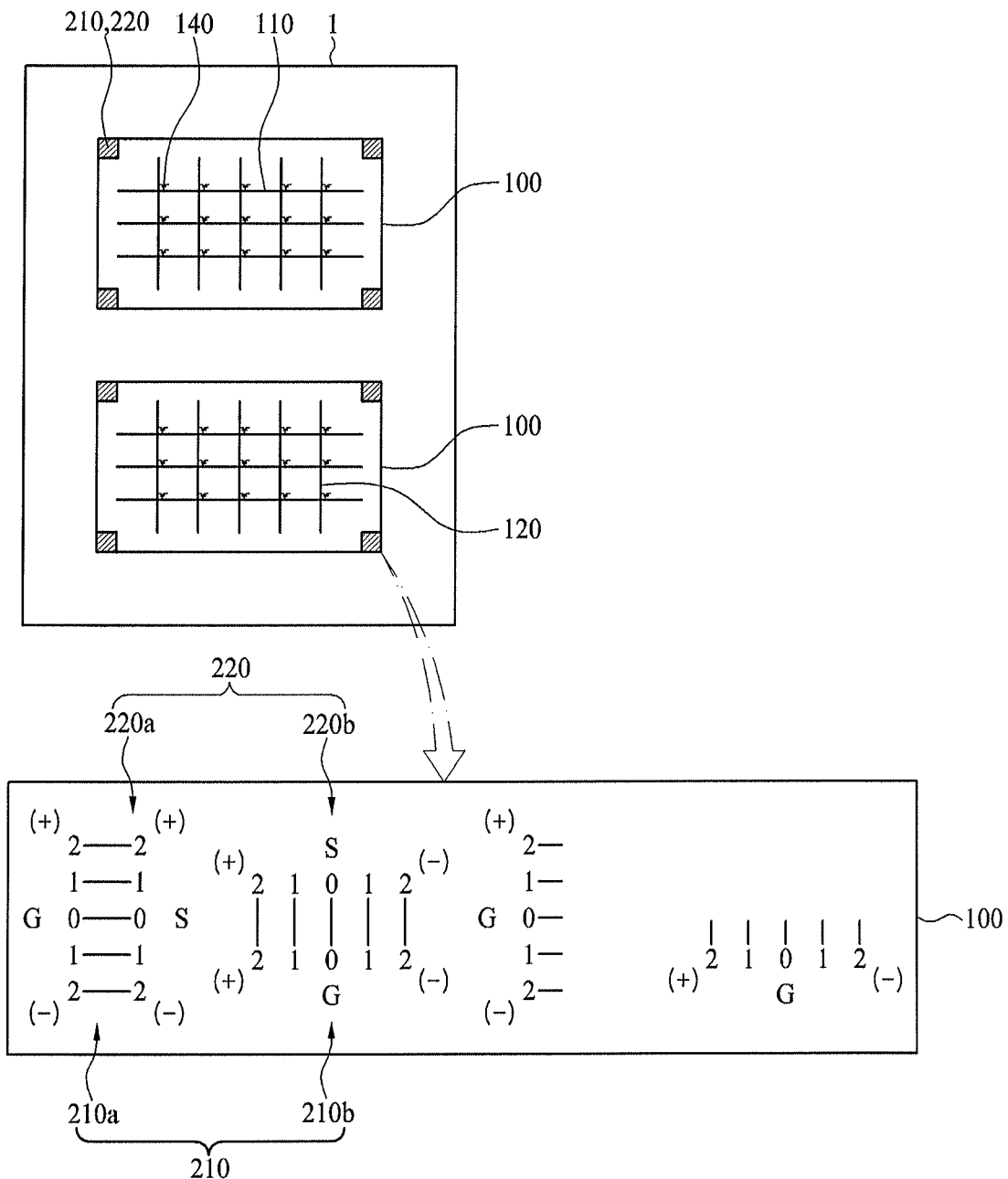
Figure 5D:
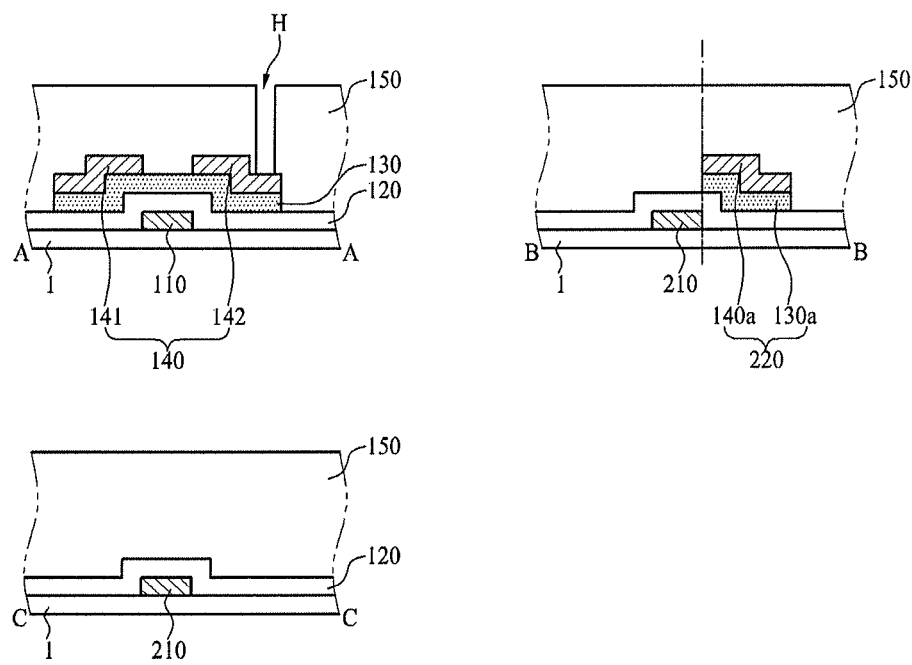

Next, as shown in FIG. 4d and FIG. 5d, a passivation film 150 is formed on the data pattern 140 and the data overlay pattern 220.

Referring to FIG. 5d, the passivation film 150 is formed on the substrate 1 including the data pattern 140 and the data overlay pattern 220. In particular, the passivation film 150 may be formed on the entire active region 100 of the substrate 1. Also, referring to an A-A section of FIG. 5d, a predetermined region of the passivation film 150 may be removed to expose the drain electrode 142, whereby a contact hole H is formed.

Although FIG. 4d is same as FIG. 4c, the passivation film 150 is actually formed on the active region 100 of FIG. 4d.

Figure 4E:
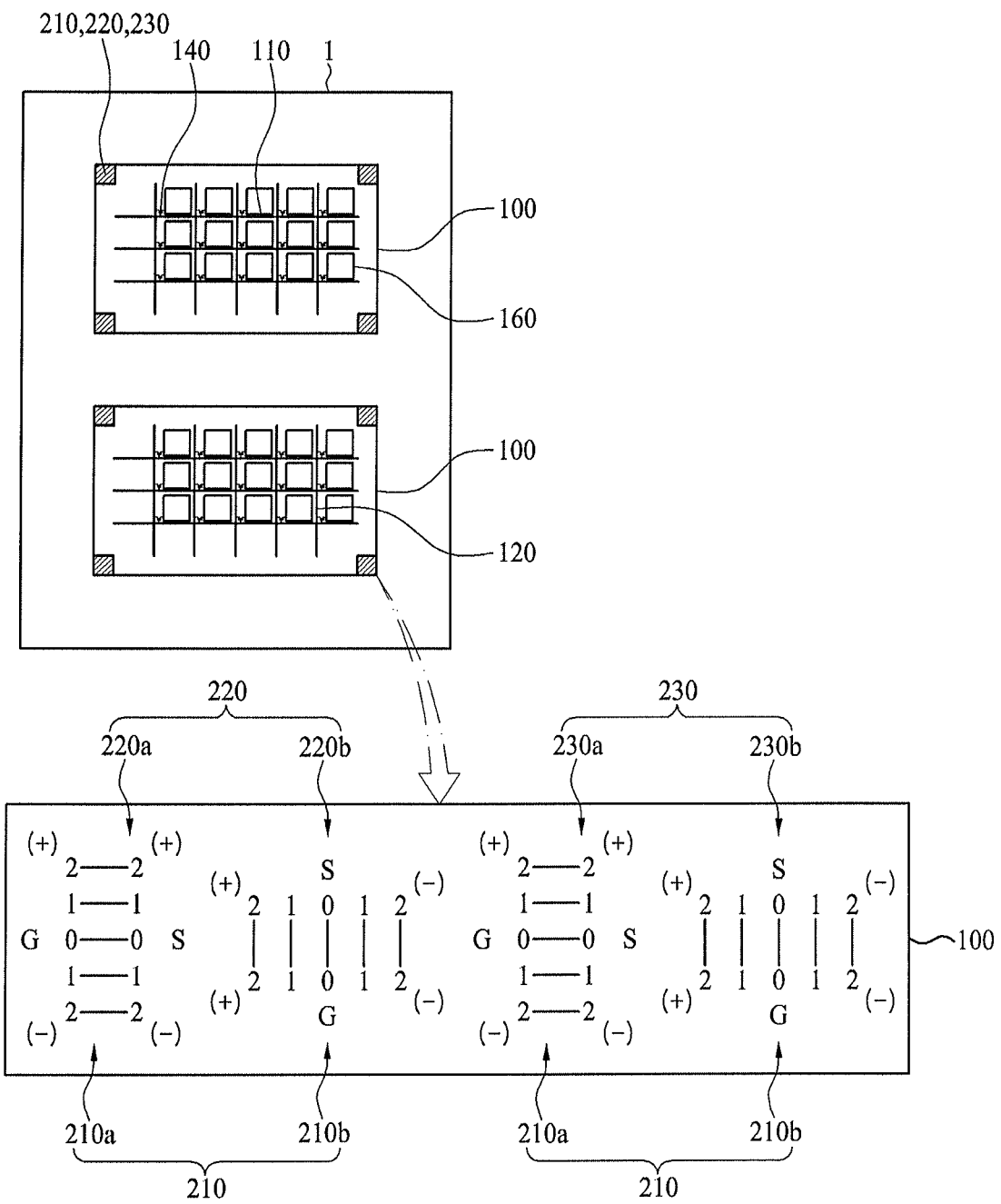
Figure 5E:
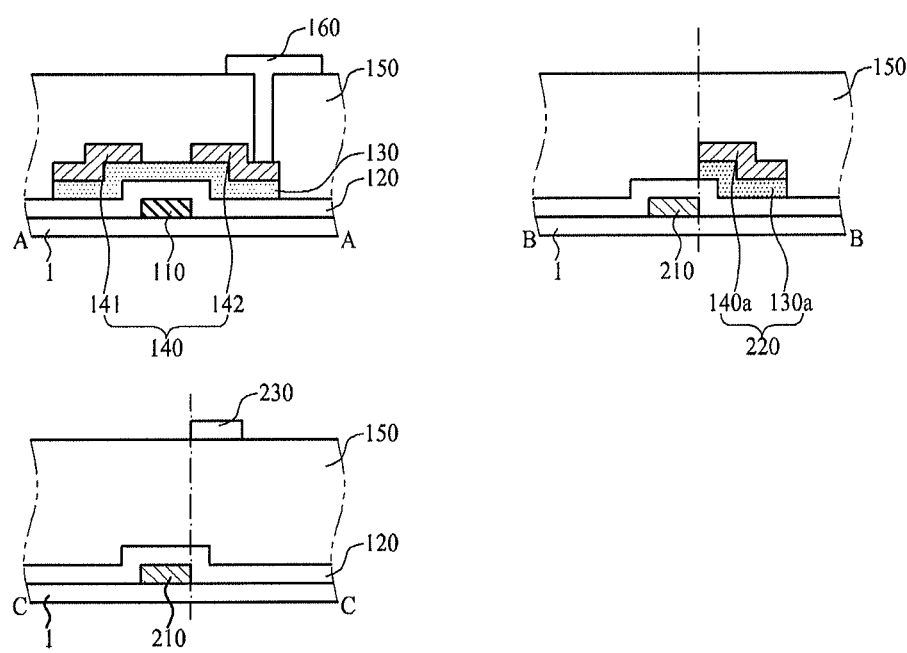

Next, as shown in FIG. 4e and FIG. 5e, a pixel electrode pattern 160 is formed within the active region 100 of the substrate 1, and at the same time a pixel overlay pattern 230 is formed at each corner region of the active region 100, especially at each edge region.

As shown in FIG. 4e and FIG. 5e, the pixel electrode pattern 160 is formed on the passivation film 150, especially to be connected with the drain electrode 142 through the contact hole H.

The pixel overlay pattern 230, as shown FIG. 4e, may include a first pixel overlay pattern 230a and a second pixel overlay pattern 230b.

The first pixel overlay pattern 230a may include gradations, numbering of the gradations, and signs of the numbering in the same manner as the aforementioned third sub pattern 202a.

The second pixel overlay pattern 230b may include gradations, numbering of the gradations, and signs of the numbering in the same manner as the aforementioned fourth sub pattern 202b.

Also, the first pixel overlay pattern 230a and the second pixel overlay pattern 230b may include a title P of the pixel electrode pattern 160.

The pixel electrode pattern 160 and the pixel overlay pattern 230 are formed through one patterning process at the same time. Accordingly, the pixel electrode pattern 160 and the pixel overlay pattern 230 may be made of the same material. For example, the pixel electrode pattern 160 and the pixel overlay pattern 230 may be formed through a photolithography process. In this case, the pixel electrode pattern 160 and the pixel overlay pattern 230 may be formed at the same time by using a pixel mask pattern corresponding to the pixel electrode pattern 160 and the pixel overlay pattern 230.

As marked with a dotted line in a C-C section of FIG. 5e, if one end of the gate overlay pattern 210 meets one end of the pixel overlay pattern 230, it may be determined that a shift between the gate overlay pattern 210 and the pixel overlay pattern 230 will not occur.

Meanwhile, although not shown, a sub overlay pattern may additionally be formed outside the active region in the same manner as the related art.

The aforementioned substrate for a display device may be used as, but not limited to, a thin film transistor substrate for a liquid crystal display device or a thin film transistor substrate for an organic light emitting device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention claimed is:

1. A substrate for a display device, the substrate comprising:
a first pattern and a second pattern disposed within an active region of the substrate;
a first overlay pattern disposed at corner regions of the active region and made of the same material as that of the first pattern; and
a second overlay pattern disposed at corner regions of the active region and made of the same material as that of the second pattern,
wherein the first overlay pattern includes gradations, and the second overlay pattern includes gradations to face the gradations of the first overlay pattern.

2. The substrate of claim 1, wherein the first overlay pattern includes a first sub pattern having gradations arranged in a first direction and a second sub pattern having gradations arranged in a second direction different from the first direction,
wherein the second overlay pattern includes a third sub pattern having gradations arranged in the first direction and a fourth sub pattern having gradations arranged in the second direction, and
wherein the first sub pattern and the third sub pattern symmetrically face each other, and the second sub pattern and the fourth sub pattern symmetrically face each other.

3. The substrate of claim 1, wherein the first overlay pattern includes at least one of numbering of the gradations, signs of the numbering and a title representing the first pattern, and
wherein the second overlay pattern includes at least one of numbering of the gradations, signs of the numbering and a title representing the second pattern.

4. The substrate of claim 1, wherein a plurality of the first overlay patterns are disposed at one corner region within the active region.

* * * * *